(12) United States Patent
Yang (10) Patent No.: US 6,360,348 B1
(45) Date of Patent: Mar. 19, 2002

(54) METHOD AND APPARATUS FOR CODING AND DECODING DATA

(75) Inventor: Jian Yang, Mansfield, MA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/384,530

(22) Filed: Aug. 27, 1999

(51) Int. Cl.[7] .............................................. H03M 13/00
(52) U.S. Cl. ...................... 714/784; 714/759; 375/342
(58) Field of Search ................................ 714/784–785, 714/781, 759, 746, 792, 800, 789, 790, 782; 712/217, 225, 36; 375/265, 222, 141, 342; 708/492; 458/433, 447, 463; 716/16, 17; 324/41; 709/245

(56) References Cited

U.S. PATENT DOCUMENTS

| | | | | |
|---|---|---|---|---|
| 3,668,632 A | * | 6/1972 | Oldham, III ................ | 714/775 |
| 4,958,349 A | * | 9/1990 | Tanner et al. ............... | 714/759 |
| 5,329,618 A | * | 7/1994 | Moati et al. ................ | 709/245 |
| 5,627,843 A | * | 5/1997 | Deng et al. ................. | 714/785 |
| 5,701,314 A | * | 12/1997 | Armstrong et al. ......... | 714/765 |
| 5,926,647 A | * | 7/1999 | Adams et al. ............... | 712/36 |
| 5,942,005 A | * | 8/1999 | Hassner et al. ............. | 714/784 |
| 5,948,117 A | * | 9/1999 | Weng et al. ................. | 714/784 |
| 6,075,812 A | * | 6/2000 | Cafarella et al. ........... | 375/206 |
| 6,131,178 A | * | 10/2000 | Fujita et al. ................ | 714/784 |
| 6,138,133 A | * | 10/2000 | Oh ............................... | 708/492 |
| 6,167,559 A | * | 12/2000 | Furtek et al. ................ | 716/16 |
| 6,173,429 B1 | * | 1/2001 | Twitchell et al. ........... | 714/746 |
| 6,226,334 B1 | * | 5/2001 | Olafsson ..................... | 375/342 |

OTHER PUBLICATIONS

Chi (A new fast Reed–Solomon decoding algorithm without Chien search; IEEE, Oct. 14, 1993).*

Clarke et al. (Implementation of dynamic look–up tables; IEEE, Nov. 1994).*

Nasiopulos, et al. (Adaptive compression coding; IEEE, Aug. 1991).*

Nasiopoulos et al., "Adaptive Compression Coding," IEEE Transactions on Communications, vol. 39, No. 8, pp. 1245–1254 (Aug. 1991).

Chi, "A New Fast Reed–Solomon Decoding Algorithm Without Chien Search," IEEE/IEE Electronic Library, Military Communications Conference, vol. 3, pp. 948–952 (Oct. 1993).

Clarke et al., "Implementation of Dynamic Look–Up Tables," IEEE/IEE Electronic Library, Computers and Digital Techniques, vol. 141, pp. 391–397 (Nov. 1994).

PCT International Search Report, PCT/US00/22631, International file date Aug. 17, 2000, ( 3 pgs).

* cited by examiner

*Primary Examiner*—Phung M. Chung
*Assistant Examiner*—Guy Lamarre (57) ABSTRACT

A method and apparatus for encoding/decoding data, wherein for one embodiment, during [During] encoding, a microprocessor (201) calculates $Y_m$ by standard Reed–Solomon encoding techniques. The microprocessor (201) then utilizes $Y_m$ as an index to a look-up table (203), and is returned $G_0Y_m, G_1Y_m, \ldots, G_{K-1}Y_m$, from the look-up table (203). During syndrome calculation, a second set of parity symbols are generated from the information symbols using the method similar to the encoder, in particular, values for $G_0Y_m, \ldots,$ GK-,Y. are obtained from a first look-up table (503) in a similar manner as encoder to determine the values for $G_0Y_m, G_1Y_m, \ldots, G_{K-1}Y_m$. A second look-up table (505) is set up to determine roots of the error locator polynomial. The second look-up table consists of several tables and each table contains (Q–1) elements, where Q is the size of the GF(Q) field. The mth look-up table stores Galois Field element $\alpha^{-mi}$ at location i if the greatest common denominator between (Q–1) and m (GCD(Q–1, m))=1. If GCD(Q–1,m)≠1, then the mth look-up table actually consists of (GCD(Q–1,m)) sub-tables storing GF element $\alpha^{-(mj=i)}$, where j=0, 1, . . ., GCD(Q–1,m)–1.

20 Claims, 6 Drawing Sheets

LOOKUP TABLE m

| $\alpha^0$ | $\alpha^{-m}$ | $\alpha^{-2m}$ | $\alpha^{-3m}$ | ... | $\alpha^{-(Q-2)m}$ |
|---|---|---|---|---|---|

LOCATION: 0, 1, 2, 3, ..., Q-2

FIG. 8

LOOKUP TABLE m

SUB-TABLE 0:
| $\alpha^0$ | $\alpha^{-m}$ | $\alpha^{-2m}$ | $\alpha^{-3m}$ | ... | $\alpha^{-(V-1)m}$ |
|---|---|---|---|---|---|

SUB-TABLE 1:
| $\alpha^{-1}$ | $\alpha^{-(m+1)}$ | $\alpha^{-(2m+1)}$ | $\alpha^{-(3m+1)}$ | ... | $\alpha^{-((V-1)m+1)}$ |
|---|---|---|---|---|---|

...

SUB-TABLE J-1:
| $\alpha^{-(J-1)}$ | $\alpha^{-(m+J-1)}$ | $\alpha^{-(2m+J-1)}$ | $\alpha^{-(3m+J-1)}$ | ... | $\alpha^{-((V-1)m+J-1)}$ |
|---|---|---|---|---|---|

LOCATION: 0, 1, 2, 3, ..., V-1

NOTE: $V = (Q-1)/GCD(Q-1, m)$
$J = GCD(Q-1, m)$

FIG.9

METHOD AND APPARATUS FOR CODING AND DECODING DATA

FIELD OF THE INVENTION

The present invention relates generally to coding and decoding and, in particular, to a method and apparatus for Reed-Solomon coding and decoding.

BACKGROUND OF THE INVENTION

Reed-Solomon coding is known in the art. As was first described in "Polynomial codes over certain finite fields," Reed I. S. and Solomon G., *Journal of Society of Industrial Application Mathematics* 8, 300–304 (1960), Reed-Solomon Codes can be utilized during the transmission of data to eliminate errors in the received data. The encoders rely on the mathematics of Galois fields, which are disclosed is U.S. Pat. No. 4,142,174 and 4,567,594, the disclosures of which are incorporated by reference herein. In summary, Reed-Solomon codes are defined with code symbols from a Galois Field of numbers represented as GF(Q), where $Q=2_b$ is a positive integer power of 2. A Galois Field has a finite number of elements. GF(Q) has Q elements, that can be represented by 0 and Q−1 consecutive powers, $(\alpha^0, \alpha^1, \ldots, \alpha^{Q-1})$ of a special element ($\alpha$).

Many different methods of using Reed-Solomon encoders and decoders are known in the art. One such method for using Reed-Solomon codes in error correction is to append a set of parity symbols to the transmitted data, where the word "symbol" is used to represent b bits that form an element of GF(Q) field. The parity symbols are used to detect and correct errors in the transmitted data. More particularly, an encoder treats the message bits as blocks of symbols that form a message polynomial on GF(Q) and derives the parity symbols by dividing the message polynomial (X) by a code generating polynomial (G). The parity symbols are identified as the coefficients of the remainder polynomial (C). The parity symbols are appended to the message symbols to form the coefficients of a codeword polynomial. The code generating polynomial is selected to impart desired properties to the codeword so that the codeword will belong to a particular class of error-correcting group codes. During transmission, the codeword is transmitted by appending the parity symbols to the message data as tail bits which are utilized by the receiver to correct errors in the received message polynomial (R).

Figure 1:
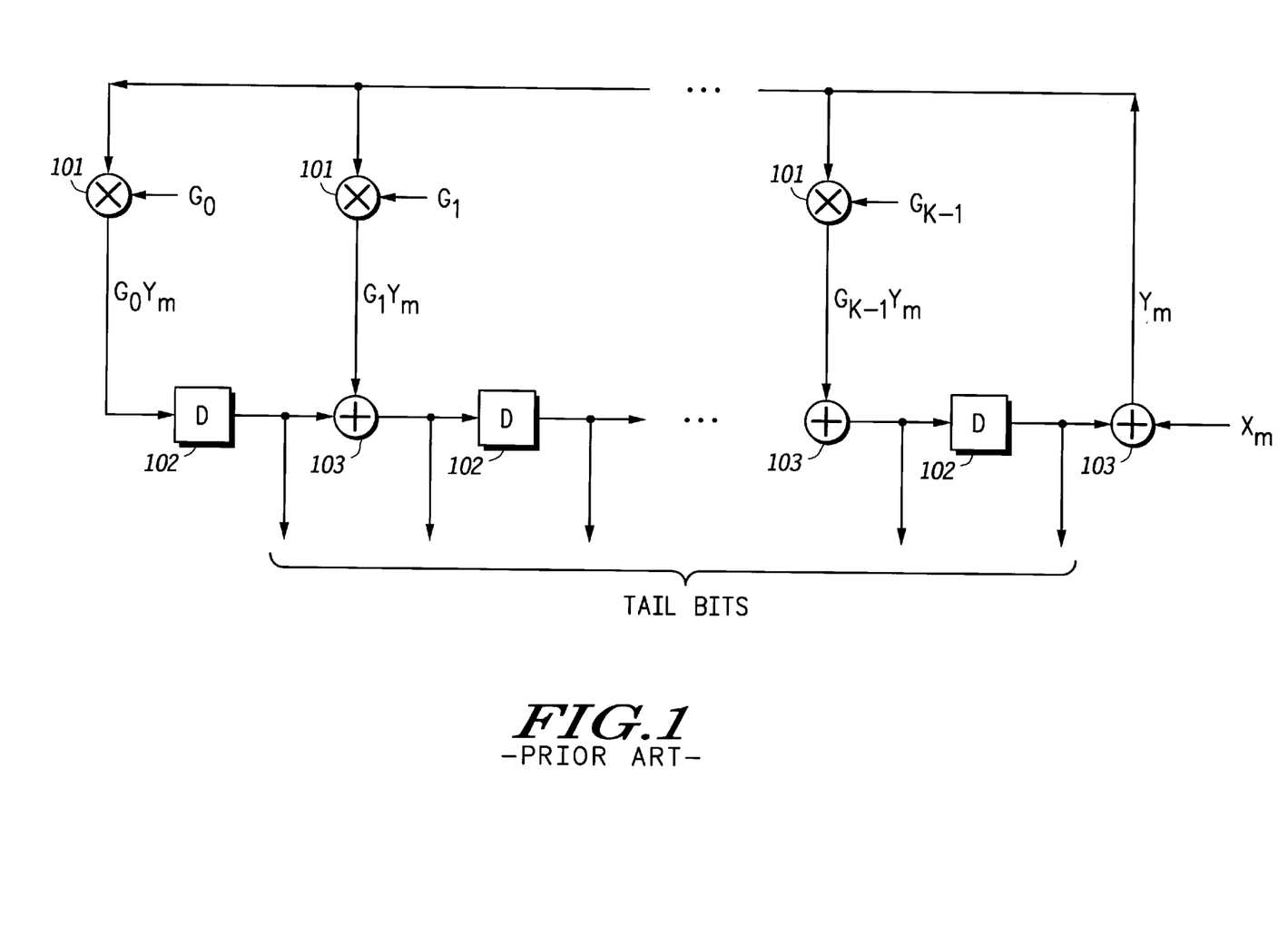
FIG. 1 is a block diagram of a prior-art Reed-Solomon encoder.

FIG. 1 shows a prior-art Reed-Solomon encoder, implemented as a shift-register polynomial division circuitry. As shown, the shift register is initialized with zeros in the delay elements (D). During each iteration, the mth data symbol $X_m$ is multiplied with the content of the right most delay element to form the symbol $Y_m$. The content of each delay element is then updated by summing the content of the delay element to its left and the product of the symbol $Y_m$ and $G_{m,}$, where $G_m$'s are the coefficients of the code generating polynomial, i.e., $G(z)=G_0+G_1z+\ldots+G_{K-1}z^{K-1}+Z^K$. (An exception is the left most delay element, which is updated with the product $G_0Y_m$.)

The parity symbols are generated by continuing to update the shift register until the end of the message block. Upon completing the iteration for the last symbol of the message block, the content of the shift register becomes the parity symbols, where the right most delay element contains the first parity symbol to be appended to the message data by the transmitter.

To date the division processing is typically carried out by dedicated hardware (e.g., multipliers 101, delay circuitry 102, and adders 103), however, with the advancement of "soft" modems, the processing has been increasingly accomplished via a microprocessor/software combination.

Although soft modems have the capability to perform Reed-Solomon encoding/decoding, a problem exists in that the prior art implementation requires a lot of processing power. In the encoder described in FIG. 1, for each message symbol, K multiplications and additions are required. Although Galois Field addition is logical XOR operation that is typically supported in microprocessor instruction set, Galois field multiplication is rarely supported and takes multiple instruction cycles to complete. For high speed modems (e.g., ADSL modems or cable modems), the Reed-Solomon encoder needs to process on the order of million of message symbols per second. The total processing power or MIPS required would be a significant percentage of if not exceeding the total processing power of a typical microprocessor. As result, the entire modem function may be difficult to accomplish via a microprocessor. Even if the microprocessor were able to accomplish modem functions, for host processing or software modems, processing power used by the modem would not be available for other applications. Therefore a need exists for a method and apparatus for encoding/decoding that can be implemented in soft modems, yet does not utilize the MIPS required by prior-art soft modems.

DETAILED DESCRIPTION OF THE PREFERRED EMBODIMENTS

To address the above-mentioned need, a method and apparatus for coding/encoding data is provided herein. During encoding, data symbol $X_m$ enters a microprocessor. The microprocessor calculates $Y_m$ by standard Reed-Solomon encoding techniques. In particular $Y_m$ is calculated by summing message symbol $X_m$ and the content of the right most delay element of the shift register. Since $Y_m$ as an element of GF(Q) can only take Q different values, the products $G_0Y_m, G_1Y_m, \ldots, G_{K-1}Y_m$ can be pre-computed and stored in a look-up table. The microprocessor then utilizes $Y_m$ as an index to a look-up table and is returned products $G_{0Ym}, G_1Y_m, \ldots, G_{K-1}Y_m$, from the look-up table. These products are used to update the shift register.

Several look-up tables are employed during decoding operations. A first look-up table is used to reduce the complexity of syndrome calculation, and a second look-up table is used to reduce the complexity for determining the roots of the error locator polynomial, in particular, the complexity of Chien searching. During syndrome calculation, values for $G_0Y_m, \ldots, G_{K-1}Y_m$ are obtained from the first look-up table in a similar manner as encoder determines values for $G_0Y_m, G_1Y_m, \ldots, G_{K-1}Y_m$. The second look-up table consists of a group of L look-up tables, where L is the order of the error locator polynomial. These tables are set up so that each table contains (Q–1) elements, where Q is the size of the GF(Q) field. The mth look-up table stores Galois Field element $\alpha^{-mi}$ at location i if the greatest common denominator between (Q–1) and m (GCD(Q–1,m)) is equal to 1. If GCD(Q–1,m)*1, then the mth look-up table actually consists of J=(GCD(Q–1,m)) sub-tables storing GF element $\alpha^{-(mi+j)}$ at location i of the jth sub-table, where j=0, 1, ..., J–1. The microprocessor initializes a starting address for each look-up table based on the corresponding coefficient of the error locator polynomial and then completes the Chien search in several iterations. At each iteration, the microprocessor sums the content of all the L tables at locations of identical offset (d) from the individual starting address and compares the sum with 1 to determine if the element corresponding to offset (d) is a root.

Since prior-art techniques require multiplications which are more complicated operations than obtaining a value from a look-up table the total processing power, or MIPS, required by the microprocessor is reduced. In addition, the look-up tables described in accordance with the present invention allows the microprocessor to utilize its register width that is typically several times of b to parallellize multiple operations with single instruction, thereby further reducing the MIPS required by the microprocessor. As result, the entire modem function may be accomplished via the microprocessor with the microprocessor capable of processing other applications.

The present invention encompasses a method for encoding/decoding data. The method comprises the steps of receiving a data symbol ($X_m$), calculating a first value as part of a standard encoding/decoding technique, and utilizing the first value as an index to a look-up table. A plurality of products of the first value are received from the look-up table with a plurality of other values, and the plurality of products are used to encode/decode the data.

The present invention additionally encompasses a method for decoding data. The method comprises the steps of performing a syndrome calculation to determine if an error exists in the transmitted data, calculating an error locator polynomial based on the syndrome calculation, and performing a Chien search to determine error locations from the error locator polynomial by accessing a plurality of look-up tables to evaluate a polynomial for each one of Q elements of a GF(Q) field.

Finally, the present invention encompasses an encoder/decoder comprising a microprocessor outputting a first value as part of standard encoding/decoding technique and a first look-up table having the first value as an input and outputting a plurality of products of the first value with a plurality of other values.

Figure 2:
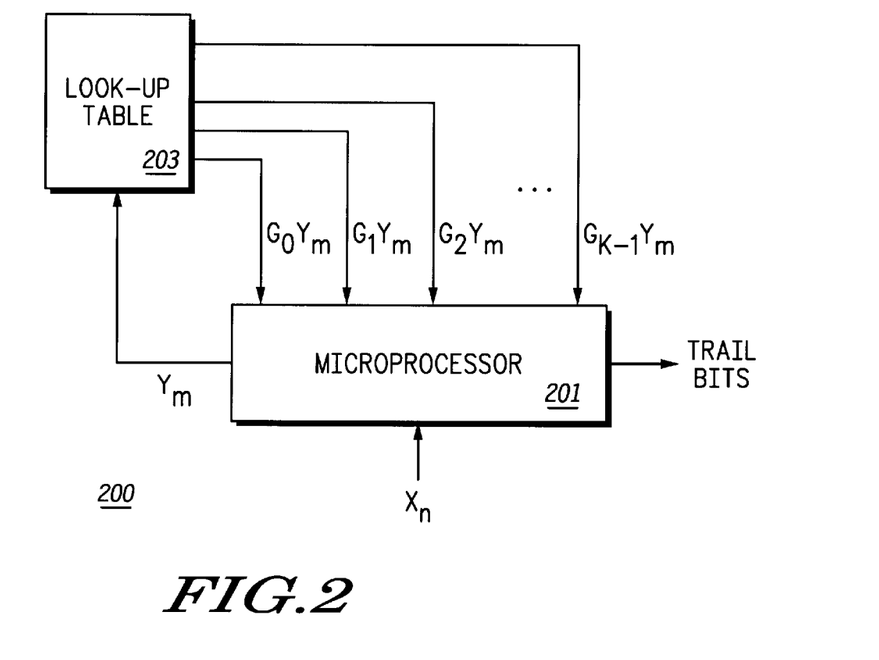
FIG. 2 is a block diagram of a Reed-Solomon encoder in accordance with the preferred embodiment of the present invention.

Turning now to the drawings, where like numerals designate like components, FIG. 2 is a block diagram of Reed-Solomon encoder 200 in accordance with the preferred embodiment of the present invention. Encoder 200 comprises microprocessor 201 and look-up table 203. In the preferred embodiment of the present invention microprocessor 201 is preferably a microprocessor with a wide register width, such as Altivec capable PowerPC processors (128-bit registers) available from Motorola or MMX capable processors (64-bit registers), including Pentium processors, available from Intel, and K6 processors available from Advanced Microcircuit Devices (AMD). In the following description, we assume the processor's register is wide enough to hold the entire shift register. Additionally, although look-up table 203 is shown existing separate from microprocessor 201, in the preferred embodiment of the present invention look-up table 203 is actually incorporated into microprocessor 201 as part of internal or external memory. Look-up table 203 stores precomputed products of $G_0Y, G_1Y, \ldots, G_{K-1}Y$, where K is the order of the code generating polynomial and equals the number of parity symbols, and Y is each one of the Q elements of the GF(Q) field. Thus, the size of table 203 is Q*K for a code over GF(Q) with K parity symbols. For a typical example of Q=256 and K=16, this amounts to 4 KB of memory.

Operation of encoder 200 in accordance with the preferred embodiment of the present invention occurs as follows: Data symbol $X_m$ is received by microprocessor 201. Microprocessor 201 calculates a first value as part of standard encoding techniques. In particular, $Y_m$ is calculated by standard Reed-Solomon encoding techniques by summing message symbol $X_m$ and a variable that is the content of the right most delay element. Microprocessor 201 then utilizes the first value ($Y_m$) as an index to look-up table 203, and is returned a plurality of products of $Y_m$ with other values. In particular, $G_0Y_m, G_1Y_m, \ldots, G_{K-1}Y_m$, is returned to microprocessor 201 from look-up table 203. The microprocessor then updates the delay elements of the shift register in parallel with these returned values to complete the encoding processing for the data symbol $X_m$.

Figure 3:
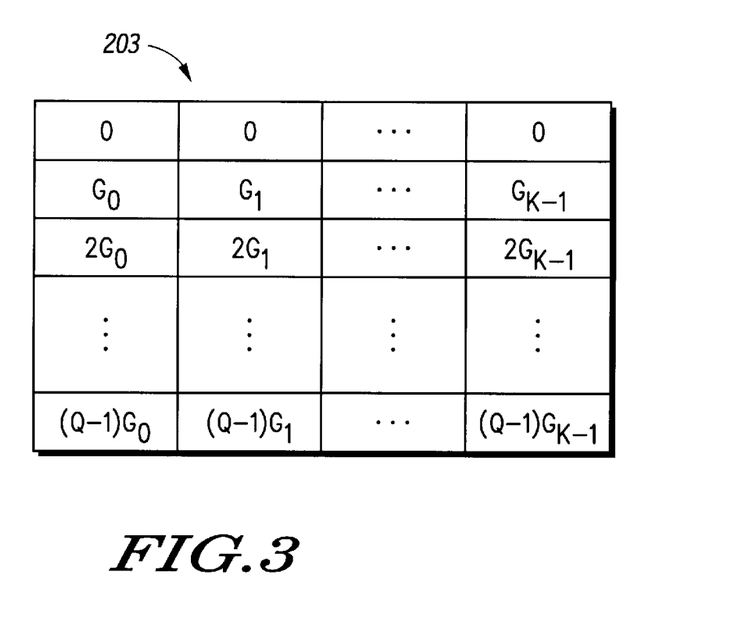
FIG. 3 is a representation of the look-up table of FIG. 2 in accordance with the preferred embodiment of the present invention.

FIG. 3 is a representation of the look-up table of FIG. 2 in accordance with the preferred embodiment of the present invention. As is evident, for every GF(Q) element there exists values for $G_0Y, G_1Y, \ldots, G_{K-1}Y$, where Y=0, 1, 2, ..., Q–1. These values are output to microprocessor 201 upon accessing table 203 with Y. In the preferred embodiment of the present invention table 203 is implemented by pre-calculating values of $G_mY$ and populating table 203 with those values. In particular, the memory is organized into Q consecutive words with the ith word holding K products $i*G_0, i*G_1, \ldots, i*G_{K-1}$. The words are partitioned into K fields of b=log2(Q) bit wide and using one field to hold one of the K products in the above order. Since the table is constant for a particular code, it can be stored in read only memory. For some cases where the modem may have several modes of operations and each mode may use a different code, it may also be desirable to dynamically generate the table into read/write type of memory upon determining the modem's operation mode.

In the preferred embodiment of the present invention, only a single table look-up is needed to obtain the results of K multiplications $G_0Y_m, G_1Y_m, \ldots, G_{K-1}Y_m$. The immediate benefit is the saving of K multiplications per message symbol. Since Galois field multiplications are computationally expensive operations on microprocessors, this substantially reduces the total processing power, or MIPS, required by the microprocessor compared to prior art techniques. As result, the entire modem function may be accomplished via the microprocessor with the microprocessor capable of processing other applications. In addition, the fact that K products are stored in a single register allows the updating of all the K shift register delay elements in parallel using a single XOR and SHIFT instruction. Another advantage is that the table is accessed one word at a time. Since each word typically consists of multiple consecutive bytes, maximum benefit is received from the burst memory access mode supported in typical systems.

In the above implementation it is assumed that the microprocessor register is wide enough to hold the entire shift register. When this is not the case, maximum benefit offered by the given register width can still be obtained by storing part of the shift register operations. Additionally, the look-table described above can be applied not only to Reed-Solomon code, it provides a general MIPS efficient method for encoding the class of code known as cyclic code of which Reed-Solomon code is a member.

Figure 4:
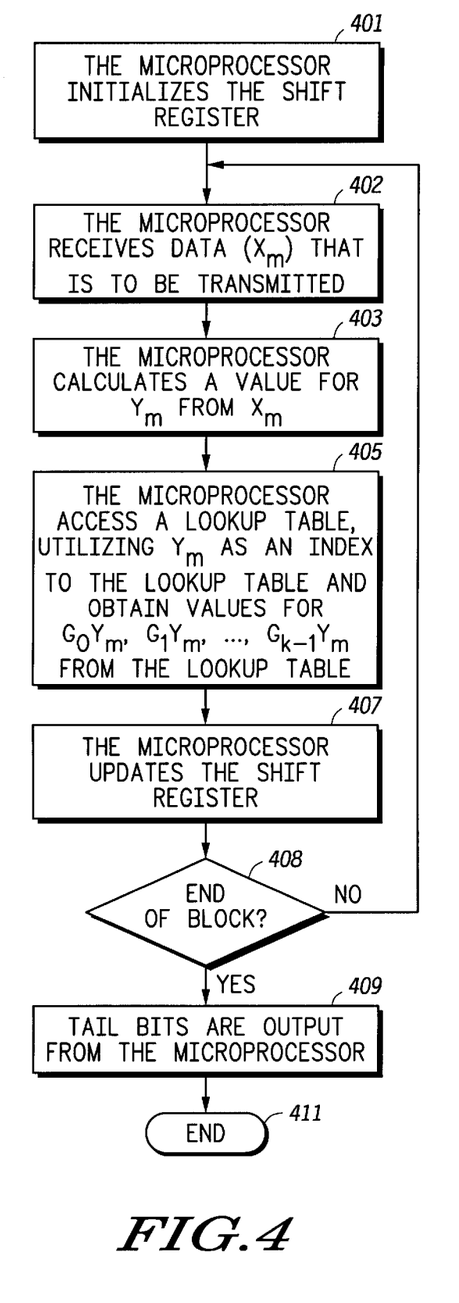
FIG. 4 is a flow chart showing operation of the Reed-Solomon encoder of FIG. 2 in accordance with the preferred embodiment of the present invention.

FIG. 4 is a flow chart showing operation of the Reed-Solomon encoder of FIG. 2 in accordance with the preferred embodiment of the present invention. The shift register is implemented as one or more integer registers of the processor that are conceptually partitioned into K fields of b bit wide each, and each field holds the content of one delay element. The logic flow begins at step 401 where the microprocessor initializes the shift register with all zeros. It then enters a loop processing the message data. At step 402 microprocessor 201 receives data symbol ($X_m$) that is to be transmitted. At step 403, microprocessor 201 calculates a value for $Y_m$ from $X_m$. Next, at step 405 microprocessor 201 accesses look-up table 203, utilizing $Y_m$ as an index to look-up table 203 to obtain values for $G_0Y_m$, $G_1Y_m$, . . . , $G_{K-1}Y_m$ from look-up table 203. The processor then updates the shift register by XOR the content of the shift register with the output of the look-up table and right SHIFT the shift register by b bits (step 407). At step 408, the microprocessor 201 determines if it has processed the last message symbol of the block. If not, steps 402–408 are repeated, otherwise the microprocessor outputs the tail bits at step 409. The logic flow ends at step 411. In the preferred embodiment of the present invention tail bits are generated as described above by outputting the final content of the shift register.

Figure 5:
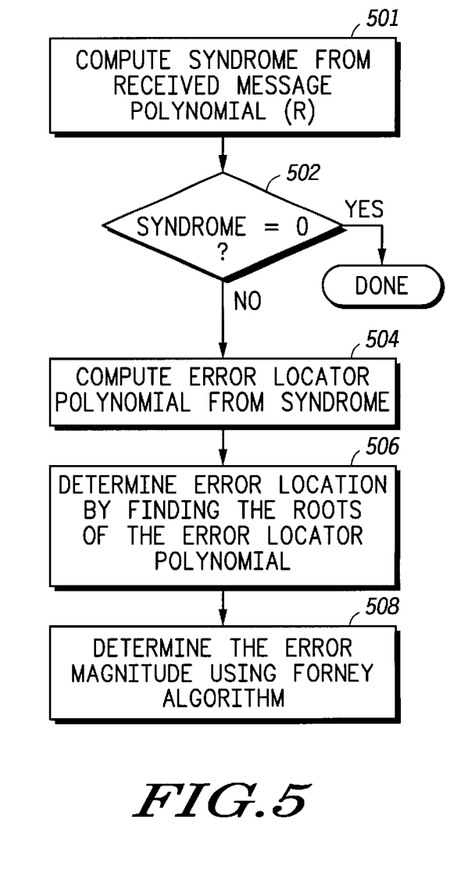
FIG. 5 is a flow chart showing the steps necessary for Reed-Solomon decoding in accordance with the preferred embodiment of the present invention.

Reed-Solomon decoding takes place in several steps, which are shown in FIG. 5. At step 501 a syndrome polynomial is calculated. As one of ordinary skill in the art will recognize the syndrome polynomial is a polynomial whose coefficients are defined as the received polynomial evaluated at the roots of the code generating polynomial. At step 502 it is determined if an error exists in the transmitted data by determining if the syndrome=0. If an error exists in the received data, as indicated by a non-zero syndrome, then an error locator polynomial is calculated (step 504) and the error locations are determined from the error locator polynomial (step 506). Finally at step 508 the error magnitudes are determined from the error locator polynomial using Forney's algorithm.

Of the four steps, steps 1 and 3 are typically the most computationally intensive steps for a microprocessor based decoder. Step 1 involves the entire received message polynomial and is needed regardless whether there is any error in the received block. A typical algorithm for step 3 involves searching through all Q elements of GF(Q) field. In contrast, steps 2 and 4 involve syndrome and error locator polynomials whose orders are typically much lower than that of the received message polynomial or the size of the GF(Q) field.

Figure 6:
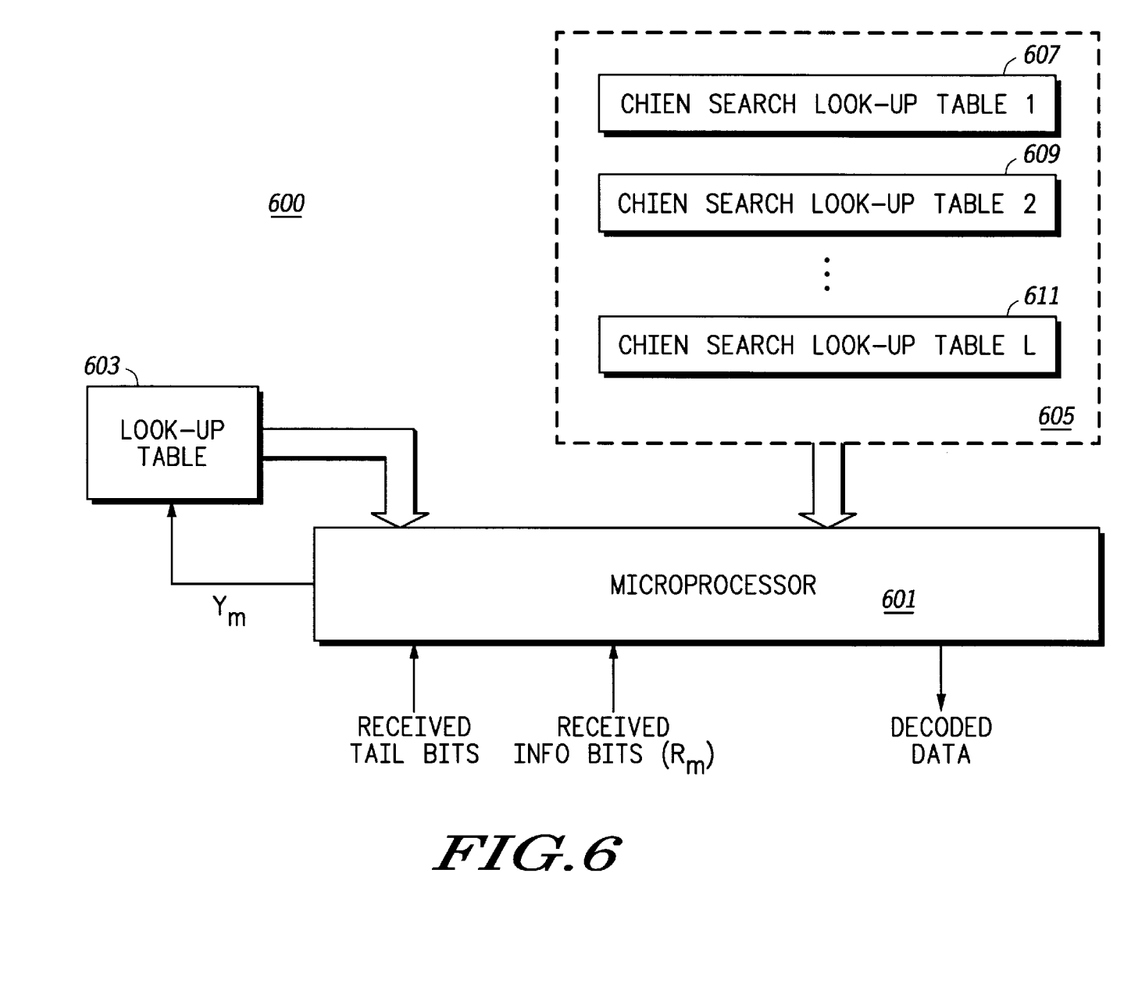
FIG. 6 is a block diagram of a Reed-Solomon decoder in accordance with the preferred embodiment of the present invention.

In order to reduce the amount of MIPS required to decode Reed-Solomon encoded data, several look-up tables are employed by decoder 600 whose block diagram is shown in FIG. 6 in accordance with the preferred embodiment of the present invention.

The first look-up table (look-up table 603) is used to reduce the complexity of step 1. It is used in a similar manner as look-up table 203 of encoder 200. During syndrome calculation decoder 600 generates a second set of tail bits from the received information symbols ($R_m$) as if they are message symbols ($X_m$) to be transmitted. It is known in the art that the syndrome can be calculated as the sum of this second set of the tail bits and the received tail bits. During the calculation of the second set of tail bits, values for $G_0Y_m$, $G_1Y_m$, . . . , $G_{K-1}Y_m$ are obtained from look-up table 603 in a similar manner as encoder to determine values for $G_0Y_m$, $G_1Y_m$, . . . , $G_{K-1}Y_m$. More particularly, microprocessor 601 calculates $Y_m$ by standard Reed-Solomon encoding techniques, i.e. by summing the information symbol $R_m$ with the content of the right most shift register as described above, then utilizes $Y_m$ as an index to look-up table 603. Table 603 returns $G_0Y_m$, $G_1Y_m$, . . . , $G_{K-1}Y_m$.

The second look-up table 605 is used to reduce the complexity of step 3. Error locations correspond to the roots of the error locator polynomial, $\lambda(z)=1+\lambda_1 z+\lambda_2 z^2+\ldots +\lambda_L z^L$. A well known algorithm for finding roots of a GF polynomial is by using a Chien search. In Chien searching, one simply evaluates the polynomial for each one of the Q elements of the GF(Q) field to determine if it is a root. Clearly, straight forward implementation of Chien search would consume a lot of processing power, as an Lth order polynomial needs to be evaluated Q times. To speed up the processing, look-up table 605 is utilized. Table 605 actually consists of a set of L look-up tables 607–611 that are utilized during Chien searching.

Figure 7:
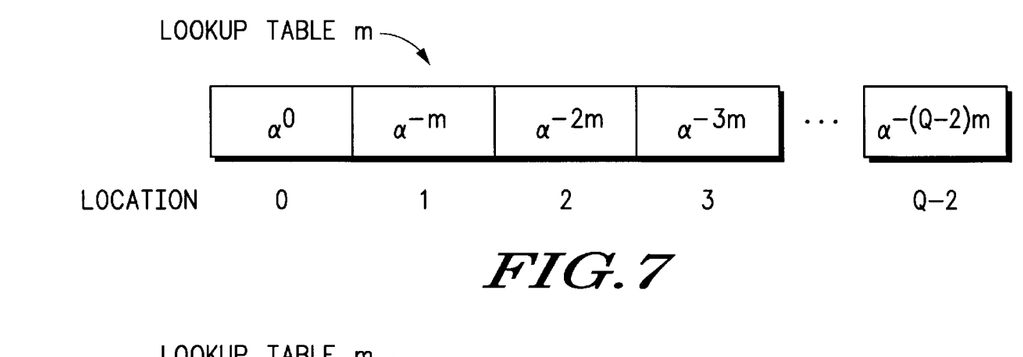
FIG. 7 is an illustration of a Chien search look-up table for GF(Q), when GCD(Q−1,m)=1, in accordance with the preferred embodiment of the present invention.

Tables 607–611 are set up so that each table contains (Q−1) elements, where Q is the size of the GF(Q) field. The mth look-up table stores Galois Field element a at location i if the greatest common denominator between (Q−1) and m (GCD(Q−1,m)) is equal to 1. In other words, the mth look-up table stores Galois Field (GF) element $\alpha^{-mi}$ at location i if (Q−1) and m are mutually prime numbers. This is shown in FIG. 7. It is noted that $\alpha^{-m(i+Q-1)}=\alpha^{-mi}$, i.e. the table so constructed is periodic with period Q−1 and FIG. 7 shows a single period of the table.

Figure 8:
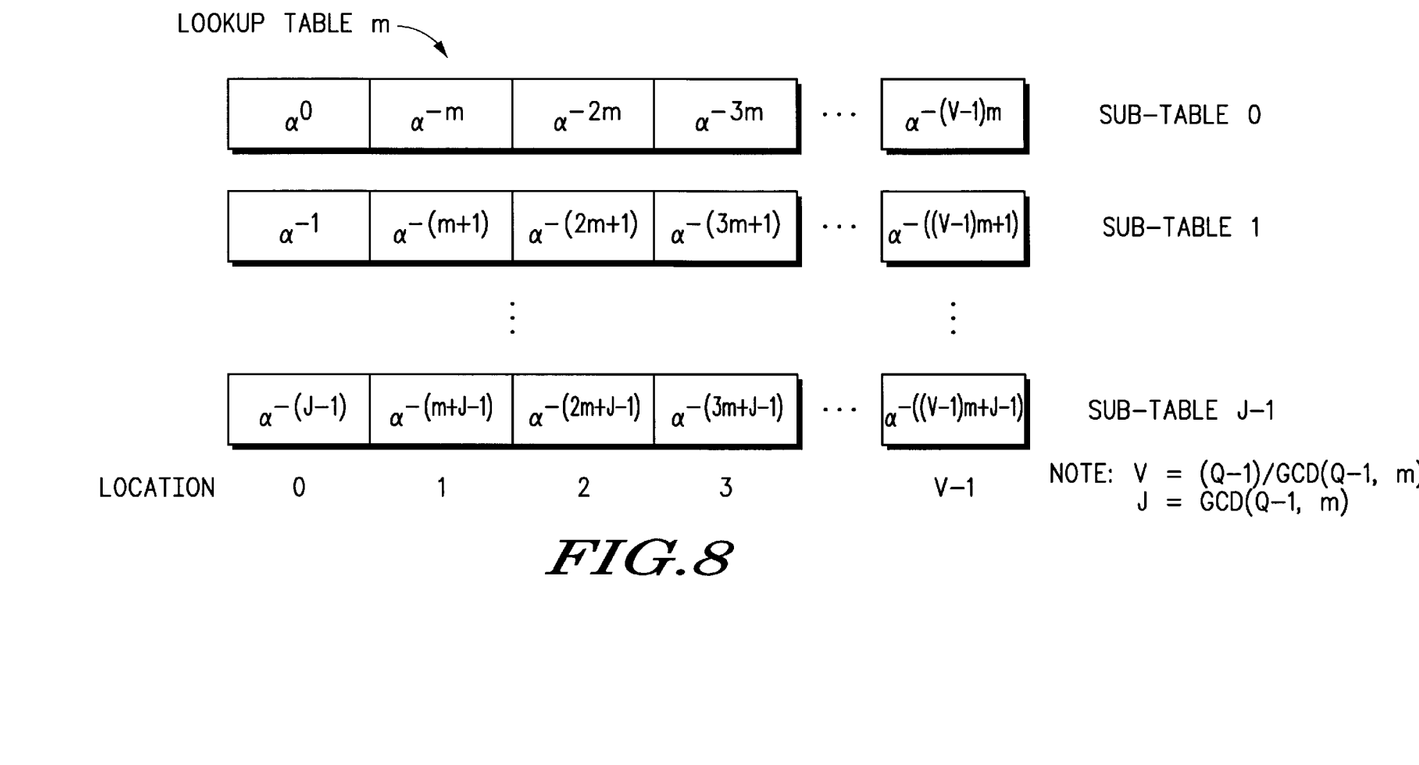
FIG. 8 is an illustration of a Chien search look-up table for GF(Q), when GCD(Q−1,m)≠1, in accordance with the preferred embodiment of the present invention.

If GCD(Q−1,m) does not equal 1, then the mth look-up table actually contains (GCD(Q−1,m)) sub-tables storing GF element $\alpha^{-(mi+j)}$, where j=0, 1, . . . GCD(Q−1,m)−1. Each sub-table is periodic with period V=(Q−1)/GCD(Q−1,m) due to the fact that $\alpha^{-m(i+v)+j)}=\alpha^{-(mi+j)}$. FIG. 8 shows a single period of each sub-table. All tables have the property that starting with any location i, the table stores {$Tu^m$:$u=\alpha^0, \alpha^{-1}, \alpha^{-2}, \ldots$} in consecutive locations, where T is the content at location i. Additionally, each table or a collection of sub-tables contains every non-zero element of GF(Q).

During Chien searching, microprocessor 601 evaluates the error locator polynomial at locations, $\alpha^0$, $\alpha^{-1}$, $\alpha^{-2}$, $\alpha^{-3}$, etc. in that order. To utilize the table, microprocessor 601 determines a starting address for each of the L look-up tables during the initialization stage. This is done for the mth look-up table by determining in the table the location whose content is $\lambda_m$, the $z^m$ coefficient of the error locator polynomial. For the case where the table is a collection of sub-tables, the microprocessor 601 first selects a sub-table and then determines the starting address of the selected sub-table. Microprocessor 601 then completes the Chien search in several iterations. At each iteration, microprocessor 601 sums the content of all the L tables at locations of identical offset (d) from the individual starting address (determined with the procedure described above). Due to the property of the table, the sum becomes, $S(d)=\lambda_1 u+\lambda_2 u^2 +\ldots +\lambda_L u^L$ $1u=\alpha^{-d}=\lambda(\alpha^{-d})-1$, where, L is the order of the error locator polynomial. In other words, the sum at offset d is the difference of the value of the error locator polynomial for element $\alpha^{-d}$ and 1. Thus, the microprocessor can determine if $\alpha^{-d}$ is a root by comparing S(d) with 1. The microprocessor then advances the offset to prepare for the next iteration. If B is the register width of the microprocessor, the microprocessor can compute B consecutive sums at each iteration and advance the offset by B symbols. Thus the benefit of the table comes from replacing 2B multiplications with a single XOR instruction.

Since offset of 0 ($\alpha^0$) corresponds to the error location of the last received symbol, offset of 1 ($\alpha^{-1}$) corresponds to the error location of the second to last received symbol, etc., the search may stop after the element corresponding to the first received symbol has been checked, as we have already exhausted all possible locations where error may occur. This offers another complexity reduction for shortened Reed-Solomon codes. As is known in the art, a shortened code is equivalent to a original Reed-Solomon code with Q–1symbol block size (including parity symbols), where the first few symbols are forced to zero (thus is known a priori by the decoder) and are not transmitted. Since the table is accessed by reading consecutive locations, maximum benefit is received from the burst memory mode supported by most processors.

Figure 9:
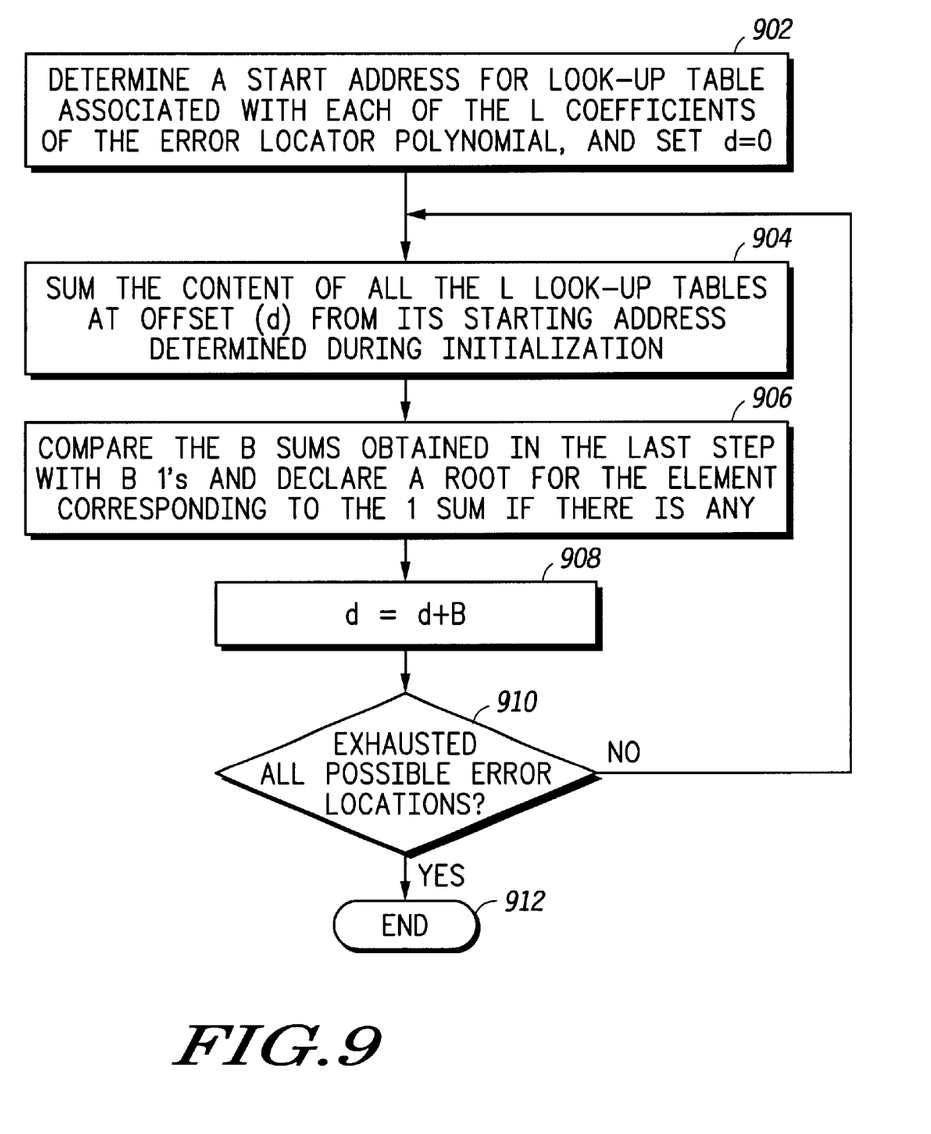
FIG. 9 is a flow chart showing the steps of the look-up table based Chien search in accordance with the preferred embodiment of the present invention.

FIG. 9 is a flow chart showing steps of the look-up table based Chien search in accordance with the preferred embodiment of the present invention. At the initialization step 902, microprocessor 601 determines a starting address for the look-up table associated with each of the L coefficients of the error locator polynomial, and sets an offset (d) to zero. Microprocessor 601 then completes the Chien search in several iterations. In each iteration, at step 904, microprocessor 601 sums the contents of all the L look-up tables at offset (d) from its starting address determined during initialization stage. Microprocessor 601 then at step 906 compares the B sums obtained in step 904 with B 1's. For each of the B sum that is equal to 1, microprocessor declares the GF(Q) element associated with the sum to be a root of the error locator polynomial. At step 908, microprocessor increment the offset (d) by B. At step 910, microprocessor determines if it has exhausted all possible error locations, and repeats iteration steps 904–910 if not exhausted. The processing ends at step 912 after microprocessor has exhausted all possible error locations.

Since the order (L) of the error locator polynomial can not exceed K/2, K/2 tables will need to be built to handle Reed-Solomon code with K parity symbols. As described above, the tables and the sub-tables are periodic and thus their size can be one period as long as circular addressing is used to access them, i.e. the address wraps around the end of the table/sub-table modulo the period of the table/sub-table. As an typical example of Q=256 and K=16, the total storage for all the K/2 tables is (Q–1)*K/2=2040 byte, less than 2 KB. For microprocessors with circular addressing capability, a single period of each table is stored. For other microprocessors, it may be MIPS consuming to implement circular look-up tables in software. In these cases, GCD(Q–1,m)+1 periods are stored. This way, no address wrap around occurs, and linear addressing can be used to index into the tables.

In an alternate embodiment of the present invention an additional table with Q–1 zero entries is created. The table is then used for coefficient of the error locator polynomial ($\lambda_m$) that is zero.

The descriptions of the invention, the specific details, and the drawings mentioned above, are not meant to limit the scope of the present invention. For example, although the preferred embodiment of the present invention utilizes look-up tables during Reed-Solomon coding/decoding, one of ordinary skill in the art will recognize that look-up tables may be utilized in other forms of coding/decoding. It is the intent of the inventors that various modifications can be made to the present invention without varying from the spirit and scope of the invention, and it is intended that all such modifications come within the scope of the following claims and their equivalents.

What is claimed is:

1. A method for encoding/decoding data, the method comprising the steps of:
   determining parameters of an error-correction code;
   dynamically generating a look-up table based on the parameters of the error-correction code;
   receiving a data symbol ($X_m$);
   calculating a first value as part of a standard encoding/decoding technique;
   utilizing the first value as an index to the look-up table;
   receiving, from the look-up table, a plurality of products of the first value with a plurality of other values; and
   utilizing the plurality of products to encode/decode the data.

2. The method of claim 1 wherein the step of calculating the first value as part of the standard encoding technique comprises the step of calculating $Y_m$ by standard Reed-Solomon encoding techniques, wherein the message bits are treated as blocks of symbols that form a message polynomial on GF(Q) and derives the parity symbols by dividing the message polynomial (X) by a code generating polynomial (G).

3. The method of claim 2 wherein the step of receiving, from the look-up table, the plurality of products comprises the step of receiving, from the look-up table, $G_0 Y, G_1 Y, \ldots, G_{K-1} Y$, where Y=0, 1, 2, . . . , Q–1 and Gm are coefficients of a code generating polynomial.

4. The method of claim 1 wherein the error-correction code is a Reed-Solomon code.

5. The method of claim 1 wherein the step of utilizing the first value as the index to the look-up table comprises the step of utilizing the first value as an index to a look-up table during a syndrome calculation.

6. The method of decoding data of claim 1 further comprising the steps of:
   accessing a second set of look-up tables as part of a second standard decoding operation; and
   receiving a value from the second set of look-up tables in response to the step of accessing the second look-up table.

7. The method of claim 6 wherein the step of accessing the second set of look-up tables comprises the step of accessing the second set of look-up tables as part of a Chien search.

8. The method of claim 7 wherein the step of accessing the second set of look-up tables comprises the step of accessing a second set of look-up tables each containing (Q–1) elements wherein the mth look-up table stores Galois Field element $a^{-mi}$ at location i=0, 1, . . . , Q–2 if the greatest common denominator between (Q–1) and m (GCD(Q–1,m)) is equal to 1.

9. The method of claim 6 wherein the step of accessing the second set of look-up tables comprises the step of accessing a second set of look-up tables that each contains (Q−1) elements wherein the mth look-up table comprises GCD(Q−1,m) sub-tables storing GF element $\alpha^{-(mi+j)}$, at location i=0, 1, . . . ,((Q−1)/GCD(Q−1,m)−1) of sub-table j, where j=0, 1, . . . , GCD(Q−1,m)−1.

10. The method of claim 9 wherein the step of accessing the second set of look-up tables comprises the step of accessing a set of circular look-up tables, wherein access beyond an end of the look-up tables are made with an address modulo having a size of the table.

11. A method for decoding data, the method comprising the steps of:
   determining parameters of an error-correction code;
   dynamically generating a look-up table based on the parameters of the error-correction code;
   using indexed addressing to access the look-up table while performing a syndrome calculation to determine if an error exists in transmitted data;
   calculating an error locator polynomial based on the syndrome calculation; and
   performing a Chien search to determine error locations from the error locator polynomial by accessing a plurality of look-up tables to evaluate a polynomial for each one of Q elements of a GF(Q) field.

12. The method of claim 11 wherein the step of performing the Chien search by accessing the plurality of look-up tables comprises the step of accessing a plurality of look-up tables wherein each look-up table contains (Q−1) elements, where Q is the size of the GF(Q) field.

13. The method of claim 11 wherein the step of performing the Chien search by accessing the plurality of look-up tables comprises the step of accessing a plurality of look-up tables wherein an mth look-up table stores Galois Field element $\alpha^{-mi}$ at location i=0, 1, . . . , Q−2 if the greatest common denominator between (Q−1) and m (GCD(Q−1,m)) is equal to 1.

14. The method of claim 11 wherein the step of performing the Chien search by accessing the plurality of look-up tables comprises the step of accessing a plurality of look-up tables wherein an mth look-up table comprises (GCD(Q−1, m) sub-tables storing GF element $\alpha^{-(mi+j)}$, at location i=0, 1, . . . , ((Q−1)/GCD(Q−1,m)−1) of sub-table j, where j=0, 1, . . . , GCD(Q−1,m)−1.

15. An encoder/decoder comprising:
   a microprocessor outputting a first value as part of standard encoding/decoding technique; and
   a first look-up table having the first value as an input and outputting a plurality of products of the first value with a plurality of other values, wherein the plurality of products are dynamically generated based on the parameters of an error-correction code.

16. The apparatus of claim 15 wherein the first value ($Y_m$) is a sum of a data symbol ($X_m$) with a variable.

17. The apparatus of claim 16 wherein the plurality of products of the first value with a plurality of other values is $G_0Y, G_1Y, \ldots, G_{K-1}Y$, where Y=0, 1, 2, . . . , Q−1 and $G_m$ are coefficients of a code generating polynomial.

18. The decoder of claim 15 further comprising a second set of look-up tables coupled to the microprocessor, wherein the second set of look-up tables are utilized during Chien searching.

19. The decoder of claim 18 wherein the second set of look-up tables contains (Q−1) elements wherein the mth look-up table stores Galois Field element $\alpha^{-mi}$ at location i if the greatest common denominator between (Q−1) and m (GCD(Q−1,m)) is equal to 1.

20. The decoder of claim 18 wherein the second set of look-up tables contains (Q−1) elements wherein each lookup table contains (Q−1) elements wherein the mth look-up table comprises (GCD(Q−1,m) sub-tables storing GF element $\alpha^{-(mi+j)}$, where j=0, 1, . . . , GCD(Q−1,m)−1.

* * * * *

UNITED STATES PATENT AND TRADEMARK OFFICE
CERTIFICATE OF CORRECTION

PATENT NO.   : 6,360,348 B1     Page 1 of 1
DATED        : March 19, 2002
INVENTOR(S)  : Jian Yang et al.

It is certified that error appears in the above-identified patent and that said Letters Patent is hereby corrected as shown below:

Title page,
Item [57], ABSTRACT,
Line 2, delete "[During]".
Line 10, change "GK-,Y" to -- $G_{k-1}, Y_m$ --.
Last line, change "$^{-(mi-i)}$" to -- $^{-(mi+j)}$ --.

Column 9,
Line 3, change "$a^{-(mi+J)}$" to -- $a^{-(mi+j)}$ --.

Signed and Sealed this

Eighteenth Day of March, 2003

JAMES E. ROGAN
*Director of the United States Patent and Trademark Office*